United States Patent
Kaklin et al.

(10) Patent No.: US 11,502,116 B2
(45) Date of Patent: Nov. 15, 2022

(54) HIGH VOLTAGE GENERATION USING RECONFIGURABLE PHOTODIODES IN PIXEL ARRAY

(71) Applicant: STMicroelectronics (Research & Development) Limited, Marlow (GB)

(72) Inventors: Filip Kaklin, Edinburgh (GB); Jeffrey M. Raynor, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 172 days.

(21) Appl. No.: 16/583,482

(22) Filed: Sep. 26, 2019

(65) Prior Publication Data
US 2021/0098512 A1    Apr. 1, 2021

(51) Int. Cl.
*H01L 27/142*    (2014.01)
*H01L 27/146*    (2006.01)

(52) U.S. Cl.
CPC ...... *H01L 27/142* (2013.01); *H01L 27/14643* (2013.01)

(58) Field of Classification Search
CPC ............. H01L 27/142; H01L 27/14643; H01L 27/1463; H01L 27/1461; H04N 5/3745; H04N 5/3698
See application file for complete search history.

(56) References Cited

U.S. PATENT DOCUMENTS

2016/0043119 A1* 2/2016 Lee ...................... H04N 5/3745
                                                              257/446
2018/0019273 A1* 1/2018 Leon-Salas ....... H01L 27/14643

FOREIGN PATENT DOCUMENTS

WO    2016090135 A1    6/2016
WO    2016090144 A1    6/2016
WO    2016112204 A1    7/2016

OTHER PUBLICATIONS

Horiguchi, F.: "Integration of series-connected on-chip solar battery in a triple-well CMOS LSI," IEEE Trans. Electron Devices, vol. 59, No. 6, pp. 1580-1584, 2012.
Law, M. K., et al.: "High-voltage generation with stacked photodiodes in standard CMOS process," IEEE Electron Device Lett., vol. 31, No. 12, pp. 1425-1427, 2010.
Park, S.-Y., et al: "Simultaneous Imaging and Energy Harvesting in CMOS Image Sensor Pixels," IEEE Electron Device Lett., vol. 3106, No. c, 2018.

(Continued)

*Primary Examiner* — Vongsavanh Sengdara
(74) *Attorney, Agent, or Firm* — Crowe & Dunlevy

(57) ABSTRACT

An imaging sensor includes a pixel array containing photodiodes, the photodiodes being isolated from one another by full thickness deep trench isolations. Row control circuitry controls which rows of the pixel array operate in an imaging mode and which rows of the pixel array operate in an energy harvesting mode, on a row by row basis. Switch circuitry selectively connects different groups of photodiodes in rows operating in the energy harvesting mode into forward biased series configurations between a voltage output line and a ground line, or into forward biased parallel configurations between the voltage output line and the ground line.

22 Claims, 5 Drawing Sheets

(56) References Cited

OTHER PUBLICATIONS

Cevik Ismail et al: "An Ultra-Low Power Energy Harvesting and Imaging (EHI) type CMOS APS Imager With Self-Power Capability", IEEE Transactions on Circuits and Systems I: Regular Papers, IEEE, US, vol. 62, N°9, Sep. 1, 2015 (Sep. 1, 2015), pp. 2177-2186, XP011667681.
F. Kaklin et al.: "Energy Harvesting Pixel Array with Deep Trench Isolated Diodes for Self-Powered Imaging", Jun. 27, 2019 (Jun. 27, 2019), XP055752246.
Fang Tang et al: "An ultra-low power current-mode CMOS image sensor with energy harvesting capability", ESSCIRC, 2010 Proceedings of the, IEEE, Piscataway, NJ, USA, Sep. 14, 2010 (Sep. 14, 2010), pp. 126-129, XP031788485.
Wang Hsuan-Tsung et al: "An image Sensor with joint sensing and energy harvesting functions" IEEE Sensors Journal, IEEE Service Center, New York, NY, US, vol. 15, N° 2, Feb. 1, 2015 (Feb. 1, 2015), pp. 902-916, XP011565443.
EPO Search Report and Written Opinion for co-pending EP Appl. No. 20196274.3 dated Jan. 15, 2021 (18 pages).
Kaklin F et al.: "High Voltage Generation Using Deep Trench Isolated Photodiodes in a Back Side Illuminated Process", 2018 IEEE International Electron Devices Meeting (IEDM), IEEE, Dec. 1, 2018 (Dec. 1, 2018), XP033501004.
First Office Action for family-related EP Appl. No. 20196274.3, report dated Aug. 4, 2022, 7 pgs.

\* cited by examiner

HIGH VOLTAGE GENERATION USING RECONFIGURABLE PHOTODIODES IN PIXEL ARRAY

TECHNICAL FIELD

This application is directed to the field of photodiodes, and in particular, to a reconfigurable photodiode pixel array capable of both image sensing as well as photovoltaic power generation.

BACKGROUND

CMOS semiconductor technology is used in a wide variety of applications, such as image sensors. Since such image sensors are often contained within portable devices, such as smartphones, they are powered by batteries. Image sensors, however, have high energy consumption, and therefore the frequent use of such image sensors may quickly drain the battery of the device into which the image sensor is incorporated. In the case of smartphones, the draining of the battery is particularly undesirable, since users desire both a long battery life and the capability of frequently utilizing the image sensors (e.g., to capture digital images or video, use video chat applications, etc.).

It is therefore known to incorporate separate photovoltaic devices that harvest energy from the environment into devices containing CMOS image sensors. However, the use of separate photovoltaic devices together with CMOS image sensors may undesirably increase the cost, complexity, and size of the device into which they are incorporated.

Therefore, CMOS image sensor systems capable of harvesting energy have been developed. However, high voltage generation using these designs is area inefficient, inflexible post manufacture, and involves additional circuitry to assist with the energy harvesting, such as boost converters and charge pumps. Still further, the parasitic structures inherently formed when known CMOS technology is employed impose additional drawbacks to high voltage generation, such as the creation of parasitic junction diodes formed due to a common shared substrate that consumes a large portion of the harvested power. Additionally, in the case where low voltage generation is used to mitigate these drawbacks, new drawbacks arise, such as low operating speed and accuracy. Also, in the case where these CMOS image sensor systems capable of harvesting energy are placed behind a lens (e.g., in the case of a camera unit which has a fixed pattern of CMOS imaging pixels and CMOS energy harvesting pixels), the projected image may cause shading over the CMOS energy harvesting pixels, reducing the power generated.

Therefore, it is evident that further development into CMOS energy harvesting technology is needed.

SUMMARY

Disclosed herein is an imaging sensor including a pixel array, each pixel of the pixel array containing a photodiode, the photodiodes being isolated from one another by full thickness deep trench isolations. Mode selection circuitry is configured to control which groups of pixels of the pixel array operate in an imaging mode and which groups of pixels of the pixel array operate in an energy harvesting mode. Switch circuitry configured to selectively connect different groups of photodiodes in rows operating in the energy harvesting mode into forward biased series configurations between a voltage output line and a ground line, or into forward biased parallel configurations between the voltage output line and the ground line.

The switch circuitry may connect a given group of photodiodes into the forward biased series configuration by connecting an anode of a first photodiode of the given group to the voltage output line, connecting an anode of a second photodiode of the given group to a cathode of the first photodiode of the given group, connecting an anode of a third photodiode of the given group to a cathode of the second photodiode of the given group, connecting an anode of a fourth photodiode of the given group to a cathode of the third photodiode of the given group, and connecting a cathode of the fourth photodiode of the given group to the ground line.

The switch circuitry may connect a given group of photodiodes into the forward biased parallel configuration by connecting an anode of a first photodiode of the given group to the voltage output line, connecting an anode of a second photodiode of the given group to a cathode of the first photodiode of the given group, connecting a cathode of the second photodiode of the given group to the ground line, connecting an anode of a third photodiode of the given group to the voltage output line, connecting an anode of a fourth photodiode of the given group to a cathode of the third photodiode of the given group, and connecting a cathode of the fourth photodiode of the given group to the ground line.

The switch circuitry may connect a given group of photodiodes into the forward biased parallel configuration by connecting an anode of a first photodiode of the given group to the voltage output line and connecting a cathode of the first photodiode of the given group to the ground line, connecting an anode of a second photodiode of the given group to the voltage output line and connecting a cathode of the second photodiode of the given group to the ground line, connecting an anode of a third photodiode of the given group to the voltage output line and connecting a cathode of the third photodiode of the given group to the ground line, and connecting an anode of a fourth photodiode of the given group to the voltage output line and connecting a cathode of the fourth photodiode of the given group to the ground line.

The switch circuitry may be configured to connect at least one group of photodiodes in rows operating in the energy harvesting mode into the forward biased series configuration and to connect at least one group of photodiodes in rows operating in the energy harvesting mode into the forward biased parallel configuration.

Each group of photodiodes may include four photodiodes.

Each row of photodiodes may be selectively switchable between the imaging mode and the energy harvesting mode.

The mode selection circuitry may include, for each first pixel of a given pixel group, an imaging selection transistor coupling an anode of the photodiode of that pixel to ground when in the imaging mode and an energy harvesting selection transistor coupling a cathode of the photodiode of that pixel to ground when in the energy harvesting mode. In addition, the mode selection circuitry may include, for each pixel of the given pixel group other than the first pixel of the given pixel group, an imaging selection transistor coupling an anode of the photodiode of that pixel to ground when in the imaging mode and an energy harvesting selection transistor coupling a cathode of the photodiode of that pixel to the switch circuitry for that pixel when in the energy harvesting mode.

The switch circuitry may include, for each pixel of the given pixel group except a last pixel of the given pixel group, a transmission gate selectively coupling the anode of the photodiode of that pixel to the energy harvesting selection transistor of a next pixel of the given pixel group, and a selection transistor selectively coupling the energy harvesting selection transistor of the next pixel of the given pixel group to ground when the transmission gate is not coupling the anode of the photodiode of that pixel to the energy harvesting selection transistor of the next pixel of the given pixel group.

DETAILED DESCRIPTION

Figure 1:
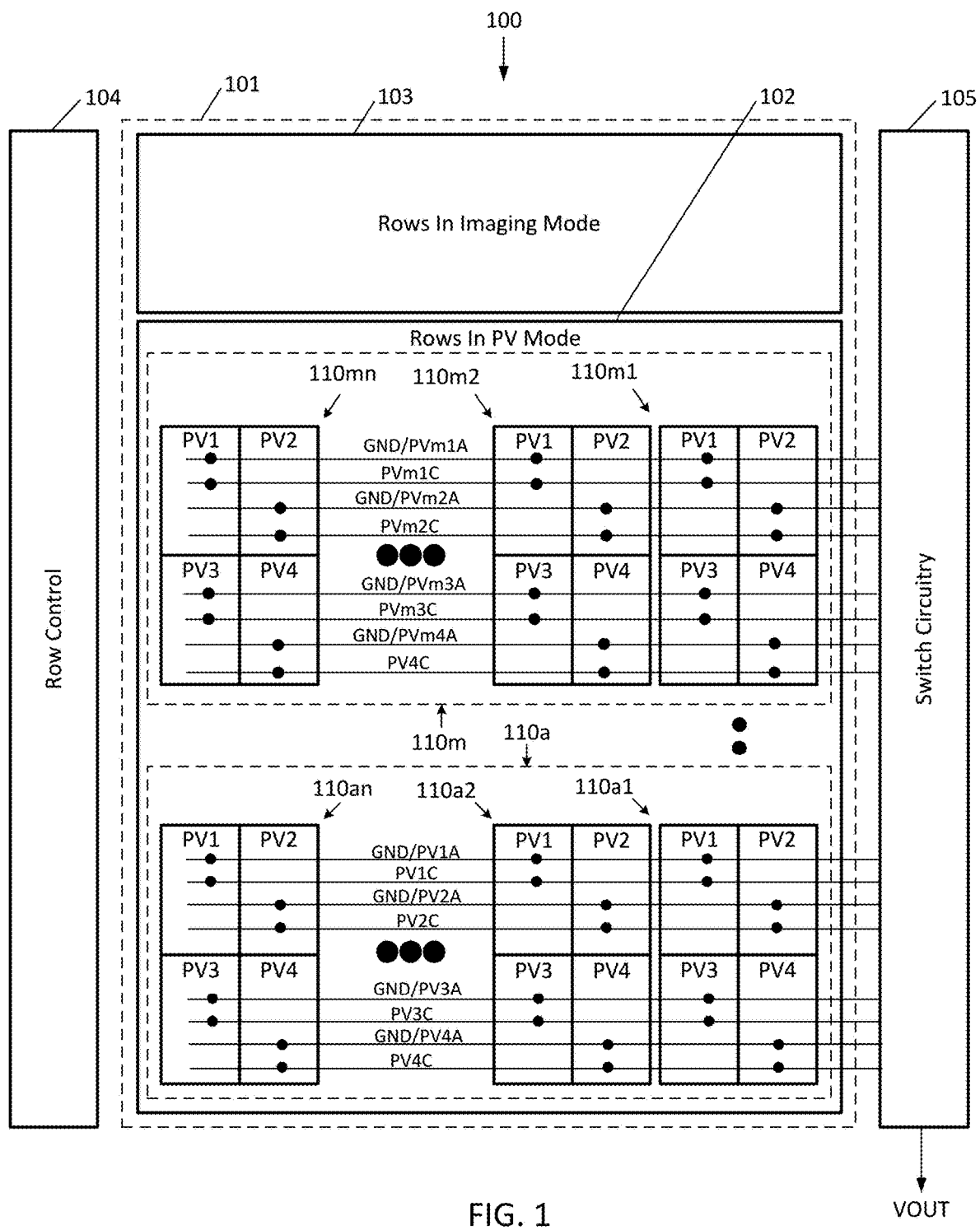
FIG. 1 is a block diagram of a reconfigurable CMOS imaging array capable of both capturing image data in an imaging mode as well as harvesting power in a photovoltaic mode.

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Now described is an imaging sensor 100. The imaging sensor 100 includes a pixel array 101 formed on a substrate. Also formed on the substrate is row control circuitry 104 and switch circuitry 105. Therefore, the image sensor may be an integrated circuit chip, formed using CMOS technology.

The pixel array 101 is an array of imaging pixels, with each imaging pixel including a photodiode. These photodiodes are isolated from each other by full thickness deep trench isolations formed in the substrate and isolation layer of the integrated circuit chip.

Row control circuitry 104 controls which rows of the pixel array 101 have their photodiodes reverse biased to operate in an imaging mode and which rows of the pixel array 101 have their photodiodes forward biased to operate in an energy harvesting mode (the row control circuitry 104 drives the EH and IM lines which will be described below). As illustrated, some rows 102 may operate in the energy harvesting mode simultaneously with other rows 103 operating in the imaging mode, meaning that some portions of the pixel array 101 may be performing image capture while (simultaneously) other portions of the pixel array 101 are harvesting energy.

The rows 102 operating in the energy harvesting mode are arranged into groups of four pixels (each pixel containing a photodiode isolated by a full thickness deep trench isolation), with there being n such groups in the x direction and m such groups in the y direction, with it being understood that n and m may be any number, and that m is dynamically selectable by the row control circuitry 104. The groups are arranged into m group rows. For example, here, there are group rows 110a ... 110m. Group row 110a contains groups 110a1 ... 110an, while group row 110m contains groups 110m1 ... 110mn. Each group contains four pixels arranged into a square. For example, group 110a1 contains pixels PV1-PV4. As will be shown later, each pixel includes a corresponding photodiode (e.g., pixel PV1 includes photodiode D1, pixel PV2 includes photodiode D2, pixel PV3 includes photodiode D3, and pixel PV4 includes photodiode D4).

Photodiodes in pixels from different groups 110 share the same cathode and anode lines, i.e., all the pixels PV1 in groups 110a1 to 110an will be connected to node PV1C and node GND/PV1A. Similarly for other pixels PV2-PV4 in these groups, the cathode and anode lines are shared, i.e., all pixels PV2-PV4 in groups 10a1 to 10an are connected to nodes PVxC and GND/PVxA (with x being 2 for PV2, 3 for PV3, and 4 for PV4).

All pixels PV1 in groups 110m1 to 110mn will share node PVm1C and node GND/PVm1A. Similarly for other pixels PV2-PV4, nodes PVmxC and GND/PVmxA are shared and connected to switch circuitry 105.

Switch circuitry 105 selectively controls the interconnections between the shared nodes PVxC and GND/PVxA, PVmxC and GND/PVmxA and GND and a single VOUT. Switches 160, 161, 162, and transistors MN17, MN19, MN21, MN23, MP9, MP10, MP11, and MP12 are part of block 105.

Figure 2A:
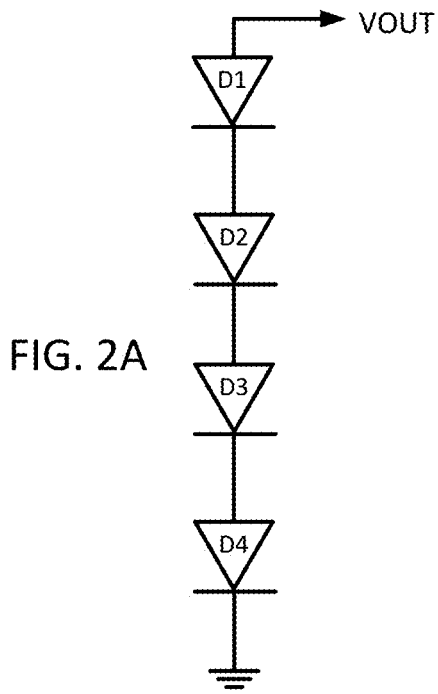
FIG. 2A is a block diagram of a reconfigurable CMOS imaging unit within the CMOS imaging array of FIG. 1 when configured for series connection.
Figure 2B:
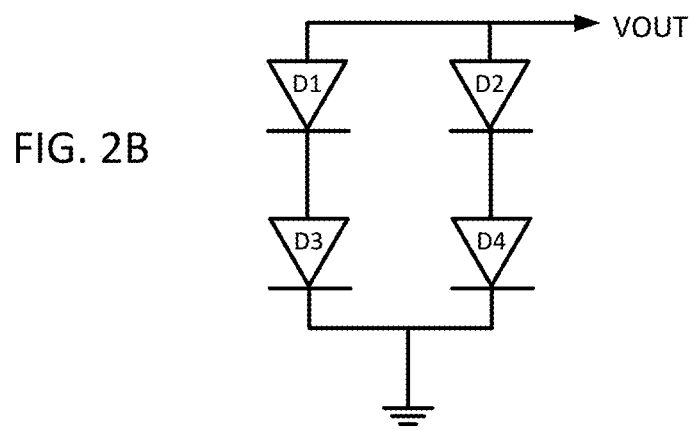
FIG. 2B is a block diagram of a reconfigurable CMOS imaging unit within the CMOS imaging array of FIG. 1 when configured for a parallel connection of two series circuits.
Figure 2C:
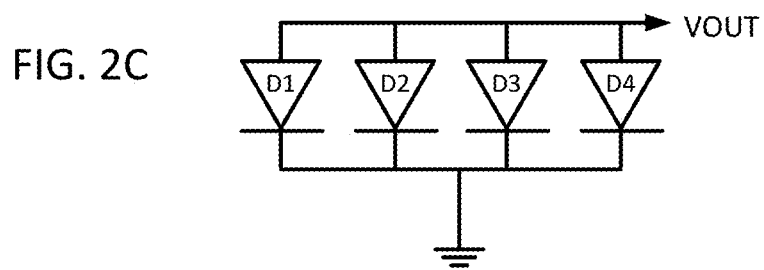
FIG. 2C is a block diagram of a reconfigurable CMOS imaging unit within the CMOS imaging array of FIG. 1 when configured for a parallel connection.

Examples of the different ways the photodiodes of the groups can be set by the switch circuitry 105 are shown in FIGS. 2A-2C. Starting with FIG. 2A, the photodiodes can be coupled in series between the voltage output line VOUT and ground. In greater detail, the anode of photodiode D1 is coupled to the voltage output line VOUT, the anode of photodiode D2 is coupled to the cathode of photodiode D1, the anode of photodiode D3 is coupled to the cathode of photodiode D2, the anode of photodiode D4 is coupled to the cathode of photodiode D3, and the cathode of photodiode D4 is coupled to ground. Notice, therefore, that this means the photodiodes D1-D4 shown in FIG. 2A are forward biased. In addition, there is isolation between all anodes and all cathodes of the diodes D1-D4, which is achieved using full thickness deep trench isolations.

Moving on to the example shown in FIG. 2B, the photodiodes can be arranged into two series strings coupled in parallel. In greater detail, the anode of photodiode D1 is coupled to the voltage output line VOUT, the anode of photodiode D3 is coupled to the cathode of photodiode D1, and the cathode of photodiode D3 is coupled to ground, while the anode of photodiode D2 is coupled to the voltage output line VOUT, the anode of photodiode D4 is coupled to the cathode of photodiode D2, and the cathode of photodiode D4 is coupled to ground. Therefore, notice that photodiodes D1 and D3 are coupled in series, and in turn coupled in parallel with the series coupled photodiodes D2 and D4. The photodiodes D1-D4 shown in FIG. 2B are forward biased.

Moving on to the example shown in FIG. 2C, the photodiodes can be coupled in parallel with one another between the voltage output line VOUT and ground. In greater detail, the anodes of photodiodes D1-D4 are coupled to the voltage output line VOUT and the cathodes of photodiodes D1-D4 are coupled to ground. The photodiodes D1-D4 shown in FIG. 2C are forward biased.

Through the dynamic selection, for the groups of the rows 110, from among the arrangements shown in FIGS. 2A-2C, the switch circuitry 105 can select or alter the voltage generated at the voltage output line VOUT. Note that each row 110 is intended to have the same selected arrangement in some embodiments, but this need not be so in other embodiments. Also, the row control circuitry 104 can select the physical location of the energy harvesting pixels, allowing the avoidance of rows that are shaded by an image projected onto those rows by a lens covering the imaging sensor 100, and the selection of rows upon which unshaded light is impinging.

The switch control circuitry 105 outputs the VOUT line. The output voltage VOUT can be used for any desired purpose in the device into which the imaging sensor 100 is incorporated.

Although the groups above have been shown to be groups of four, it should be understood that the groups may be of any number of pixels, such as two, six, or eight pixels, and that the switch circuitry 105 may accordingly couple the photodiodes of those pixels into any suitable series, parallel, or series-parallel combination. Still further, although the group rows have been shown as each containing two rows, the group rows may contain any number of group rows, meaning that the groups may be of any number of pixels in any arrangement.

Figure 3:
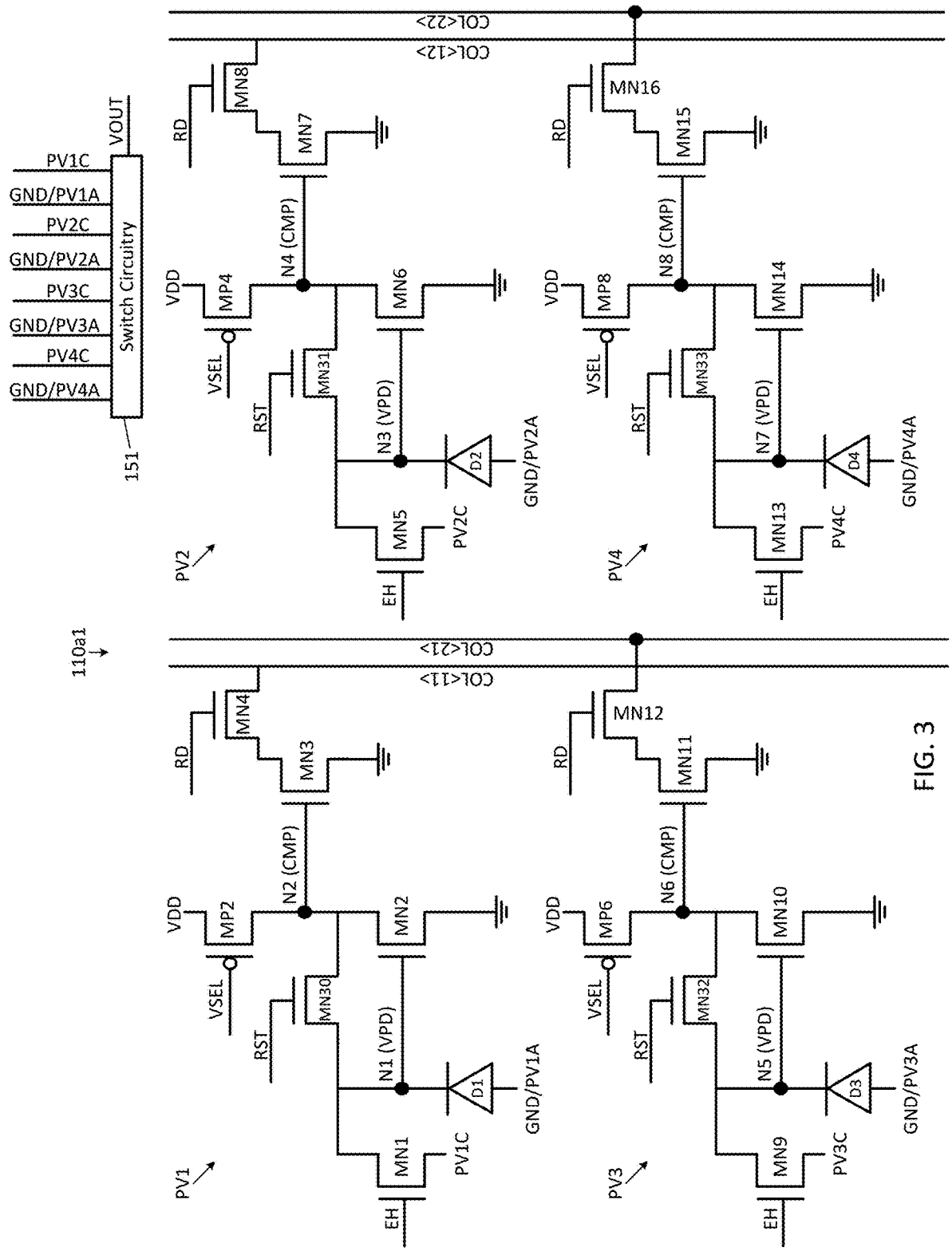
FIG. 3 is a schematic diagram of a pixel group of the reconfigurable CMOS imaging unit of FIG. 1, with the switch circuitry shown as a block diagram.

A sample electrical configuration for the pixel group 110a1 is now described with reference to FIG. 3, with it being understood that the same electrical configuration may be used for the other pixels groups as well. The pixel group 110a1 is comprised of pixels PV1-PV4.

Pixel PV1 includes n-channel transistor MN1 having a source coupled to the PV1C line, a drain coupled to node N1, and a gate coupled to the EH line. Photodiode D1 has its anode coupled to the GND/PV1A line and its cathode coupled to node N1. N-channel transistor MN30 has its source coupled to node N2, its drain coupled to node N1, and its gate coupled to the RST line. P-channel transistor MP2 has its source coupled to the supply voltage VDD, its drain coupled to node N2, and its gate coupled to the VSEL line. N-channel transistor MN2 has its source coupled to ground, its drain coupled to node N2, and its gate coupled to node N1. N-channel transistor MN3 has its source coupled to ground, its drain coupled to the source of n-channel transistor MN4, and its gate coupled to node N2. N-channel transistor MN4 has its drain coupled to line COL<11>, its source coupled to the drain of n-channel transistor MN3, and its gate coupled to the RD line.

Pixel PV2 includes n-channel transistor MN5 having a source coupled to the PV2C line, a drain coupled to node N3, and its gate coupled to the EH line. Photodiode D2 has its anode coupled to the GND/PV2A line and its cathode coupled to node N3. N-channel transistor MN31 has its source coupled to node N4, its drain coupled to node N3, and its gate coupled to the RST line. P-channel transistor MP4 has its source coupled to the supply voltage VDD, its drain coupled to node N4, and its gate coupled to the VSEL line. N-channel transistor MN6 has its source coupled to ground, its drain coupled to node N4, and its gate coupled to node N3. N-channel transistor MN7 has its source coupled to ground, its drain coupled to the source of n-channel transistor MN8, and its gate coupled to node N4. N-channel transistor MN8 has its drain coupled to line COL<12>, its source coupled to the drain of n-channel transistor MN7, and its gate coupled to the RD line.

Pixel PV3 includes n-channel transistor MN9 having a source coupled to the PV3C line, a drain coupled to node N5, and a gate coupled to the EH line. Photodiode D3 has its anode coupled to the GND/PV3A line and its cathode coupled to node N5. N-channel transistor MN13 has its source coupled to node N6, its drain coupled to node N5, and its gate coupled to the RST line. P-channel transistor MP6 has its source coupled to the supply voltage VDD, its drain coupled to node N6, and its gate coupled to the VSEL line. N-channel transistor MN10 has its source coupled to ground, its drain coupled to node N6, and its gate coupled to node N5. N-channel transistor MN11 has its source coupled to ground, its drain coupled to the source of n-channel transistor MN12, and its gate coupled to node N6. N-channel transistor MN12 has its drain coupled to line COL<21>, its source coupled to the drain of n-channel transistor MN11, and its gate coupled to the RD line.

Pixel PV4 includes n-channel transistor MN13 having a source coupled to the PV4C line, a drain coupled to node N7, and a gate coupled to the EH line. Photodiode D4 has its anode coupled to the GND/PV4A line and its cathode coupled to node N7. N-channel transistor MN33 has its source coupled to node N8, its drain coupled to node N7, and its gate coupled to the RST line. P-channel transistor MP8 has its source coupled to the supply voltage VDD, its drain coupled to node N8, and its gate coupled to the VSEL line. N-channel transistor MN14 has its source coupled to ground, its drain coupled to node N8, and its gate coupled to node N7. N-channel transistor MN15 has its source coupled to ground, its drain coupled to the source of n-channel transistor MN16, and its gate coupled to node N8. N-channel transistor MN16 has its drain coupled to line COL<22>, its source coupled to the drain of n-channel transistor MN15, and its gate coupled to the RD line.

Note that n-channel transistors MN1, MN5, MN9, and MN13 may be substituted with PMOS transistors or CMOS transmission gates in some designs.

Figure 4:
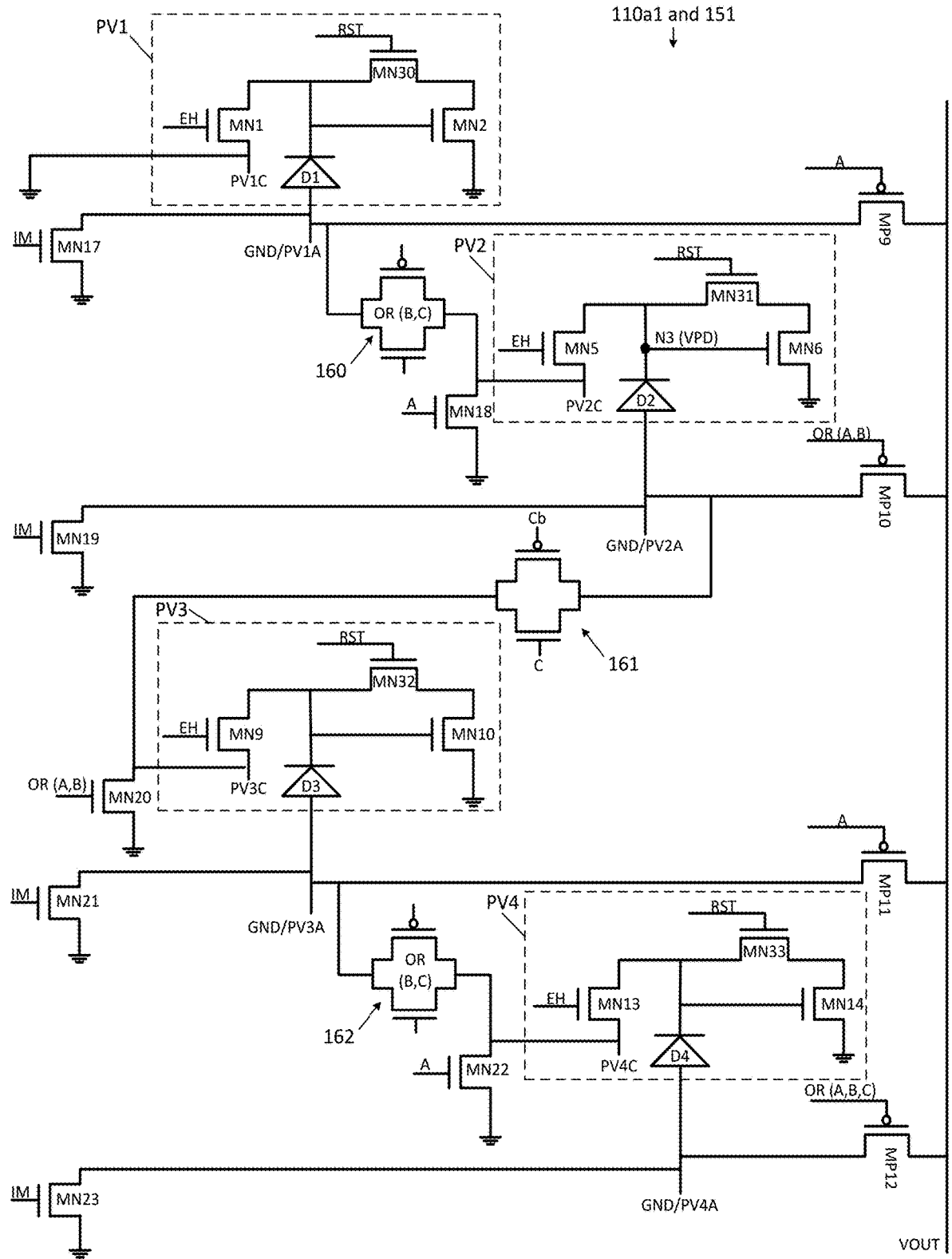
FIG. 4 is a schematic diagram of a pixel group of the reconfigurable CMOS imaging unit of FIG. 3 with the pixel shown in abbreviated form, but with the switch circuitry shown in full schematic form.

When the group row 110a is to operate in imaging mode, the row control circuitry 104 drives the EH line low and the IM line high so as to turn off n-channel transistors MN1, MN5, MN9, and MN13 and turn on n-channel transistors MN17, MN19, MN21, and MN23 (shown in FIG. 4 and described below). Since the focus of this disclosure is on energy harvesting mode, description of the group row 110a in imaging mode is not further described for brevity.

In energy harvesting mode, the row control circuitry 104 drives the EH line high so as to turn on the n-channel transistors MN1, MN5, MN9, and MN13, and drives the IM line low. In addition, the RST line is driven low to turn off n-channel transistors MN30, MN31, MN32, and MN33, and the VSEL line is driven high to turn off p-channel transistors MP2, MP4, MP6, and MP8.

In energy harvesting mode, the switch circuitry 151 suitably interconnects the various PV1C, PV2C, PV3C, and PV4C lines, as well as the GND/PV1A, GND/PV2A, GND/PV3A, GND/PV4A lines, to electrically connect the pixels PV1-PV4 into the series, parallel, or series-parallel configurations as described above.

With additional reference to FIG. 4, the structure and function of the switch circuitry 151 will be described in the context of the pixel group 110a1. Here, note that the structure of the pixels PV1-PV4 is abbreviated, with transistors not relevant to energy harvesting mode not being shown so that the remainder of the structure may be more clearly shown and understood. The pixel PV1 may be referred to as the "first pixel" in the pixel group 110a1, and the pixel PV4 may be referred to as the "last pixel" in the pixel group 110a1.

The structure of pixel PV1 is as described above with respect to FIG. 3. Here, however, it is shown that the switch circuitry 151 includes n-channel transistor MN17 having its source coupled to ground, its drain coupled to the GND/PV1A line, and its gate coupled to the IM line. P-channel transistor MP9 has its source coupled to the VOUT line, its drain coupled to the GND/PV1A line, and its gate coupled to the control signal A.

The structure of pixel PV2 is as described above with respect to FIG. 3. Here, however, it is shown that the switch circuitry 151 also includes a transmission gate 160 that operates based upon a Boolean OR operation performed on the control signal B and the control signal C to selectively couple the GND/PV1A line to the drain of n-channel transistor MN18. N-channel transistor MN18 has its drain coupled to the output of the transmission gate 160, its source coupled to ground, and its gate coupled to the control signal A. N-channel transistor MN19 has its source coupled to ground, its drain coupled to the GND/PV2A line, and its gate coupled to the IM line. P-channel transistor MP10 has its source coupled to the VOUT line, its drain coupled to the GND/PV2A line, and its gate coupled to the result of a Boolean OR operation performed on the control signal A and the control signal B.

The structure of pixel PV3 is as described above with respect to FIG. 3. Here, however, it is shown that the switch circuitry 151 also includes a transmission gate 161 that operates based upon the control signal C to selectively couple the GND/PV2A line to the drain of n-channel transistor MN20. N-channel transistor MN20 has its drain coupled to the output of the transmission gate 161, its source coupled to ground, and its gate coupled to the result of a Boolean OR operation performed on the control signal A and the control signal B. N-channel transistor MN21 has its source coupled to ground, its drain coupled to the GND/PV3A line, and its gate coupled to the IM line. P-channel transistor MP11 has its source coupled to the VOUT line, its drain coupled to the GND/PV3A line, and its gate coupled to the control signal A.

The structure of pixel PV4 is as described above with respect to FIG. 3. Here, however, it is shown that the switch circuitry 151 also includes a transmission gate 162 that operates based upon a Boolean OR operation performed on the control signal B and the control signal C to selectively couple the GND/PV3A line to the drain of n-channel transistor MN22. N-channel transistor MN22 has its drain coupled to the output of the transmission gate 162, its source coupled to ground, and its gate coupled to the control signal A. N-channel transistor MN23 has its source coupled to ground, its drain coupled to the GND/PV4A line, and its gate coupled to the IM line. P-channel transistor MP12 has its source coupled to the VOUT line, its drain coupled to the GND/PV4A line, and its gate coupled to the result of a Boolean OR operation performed on the control signal A, control signal B, and control signal C.

The following table illustrates the state of the control signals A, B, and C for setting the pixels PV1-PV4 into the series, parallel, or series-parallel configurations as described above. The states of these control signals may be programmed into the switch circuitry 105.

| Mode | Control Signal A | Control Signal B | Control Signal C |
|---|---|---|---|
| Series | 0 | 0 | 1 |
| Parallel | 1 | 0 | 0 |
| Series-Parallel | 0 | 1 | 0 |

Operation of the switch circuitry 151 and the pixel group 110a1 in energy harvesting mode will now be described. In energy harvesting mode, the EH signal is driven high, turning on the n-channel transistors MN1, MN5, MN9, and MN13, while the IM signal is driven low, turning off the n-channel transistors MN17, MN19, MN21, and MN23.

To connect the pixels PV1-PV4 and thus photodiodes D1-D4 in series (the configuration shown in FIG. 2A), control signals A and B are driven low, while control signal C is driven high. This has the effect of turning on the transmission gates 160-162, turning off the p-channel transistors MP9, MP10, and MP11, turning on the p-channel transistor MP12, turning off the n-channel transistors MN18, MN20, and MN22, and turning on the n-channel transistors MN1, MN5, MN9, and MN13. As a result of this, the photodiodes D1-D4 are connected in series and forward biased between ground and VOUT, and as light impinges upon the photodiodes D1-D4, a current path forms between ground and VOUT through n-channel transistor MN1, photodiode D1, transmission gate 160, n-channel transistor MN5, photodiode D2, transmission gate 161, n-channel transistor MN9, photodiode D3, transmission gate 162, n-channel transistor MN13, photodiode D4, and p-channel transistor MP12. Note here that pixels PV2-PV4 can each be considered to be in an "interconnected mode" because the cathodes of their diodes D3-D4 are each connected to the anodes of the diodes D1-D3 of the previous pixels PV1-PV3. For example, the cathode of the photodiode D2 is connected to the anode of the photodiode D1 through transistor MN5 and transmission gate 160, the cathode of the photodiode D3 is connected to the anode of the photodiode D2 through transistor MN9 and transmission gate 161, and the cathode of the photodiode D4 is connected to the anode of the photodiode D3 through transistor MN13 and transmission gate 162.

To connect the pixels PV1-PV4 and thus photodiodes D1-D4 in parallel (the configuration shown in FIG. 2C), control signal A is driven high, while control signals B and C are driven low. This has the effect of turning off the transmission gates 160-162, turning on the p-channel transistors MP9, MP10, MP11, and MP12, and turning on the n-channel transistors MN1, MN18, MN5, MN20, MN9, MN22, and MN13. As a result of this, the photodiodes D1-D4 are connected in parallel with each other and forward biased between ground and VOUT. As light impinges upon the photodiodes D1-D4, four current paths are formed. The first current path is formed between ground and VOUT through n-channel transistor MN1, photodiode D1, and p-channel transistor MP9. The second current path is formed between ground and VOUT through the n-channel transistor MN18, n-channel transistor MN5, photodiode D2, and p-channel transistor MP10. The third current path is formed between ground and VOUT through the n-channel transistor MN20, n-channel transistor MN9, photodiode D3, and p-channel transistor MP11. The fourth current path is formed between ground and VOUT through the n-channel transistor MN22, n-channel transistor MN13, photodiode D4, and the p-channel transistor MP12. Note here that the pixels PV1-PV4 can each be considered to be in an "isolated mode" because the cathodes of their diodes D1-D4 are not connected to the anodes of any other of the diodes, but instead are connected to ground through transistors MN1, MN5, MN18, MN9, MN20, MN13, and MN22.

To connect the pixels PV1-PV4 and thus photodiodes D1-D4 in series-parallel (the configuration shown in FIG. 2B), the control signal B is driven high, while the control signals A and C are driven low. This has the effect of turning on the transmission gates 160 and 162 while turning off the transmission gate 161, turning off the p-channel transistors MP9 and MP11, turning off n-channel transistors MN18 and MN22, turning on n-channel transistors MN1, MN5, MN20, MN9, and MN13, and turning on p-channel transistors MP10 and MP12. As a result of this, photodiodes D1 and D3 are connected in series and forward biased between ground and VOUT, photodiodes D2 and D2 are connected in series and forward biased between ground and VOUT, and the series combination of D1 and D3 is connected in parallel with the series combination of D2 and D4. As light impinges upon the photodiodes D1-D4, two current paths are formed. The first current path is formed between ground and VOUT through the n-channel transistor MN1, photodiode D1, transmission gate 160, n-channel transistor MN5, photodiode D2, and p-channel transistor MP10. The second current path is formed between ground and VOUT through the n-channel transistors MN20 and MN9, photodiode D3, transmission gate 162, n-channel transistor MN13, photodiode D4, and p-channel transistor MP12. Note here that pixels PV2 and PV4 can each be considered to be in an "interconnected mode" because the cathodes of their diodes D2 and D4 are connected to the anodes of the diodes D1 and D3 of the previous pixels PV1 and PV3. For example, the cathode of photodiode D2 is connected to the anode of the photodiode D1 through transistor MN5 and transmission gate 160, and the cathode of the photodiode D4 is connected to the anode of the photodiode D3 through the transistor MN13 and transmission gate 162. Also note here that pixel PV3 can be considered to be in an "isolated mode" because the anode of its photodiode D3 is connected to ground through transistors MN9 and MN20.

Figure 5:
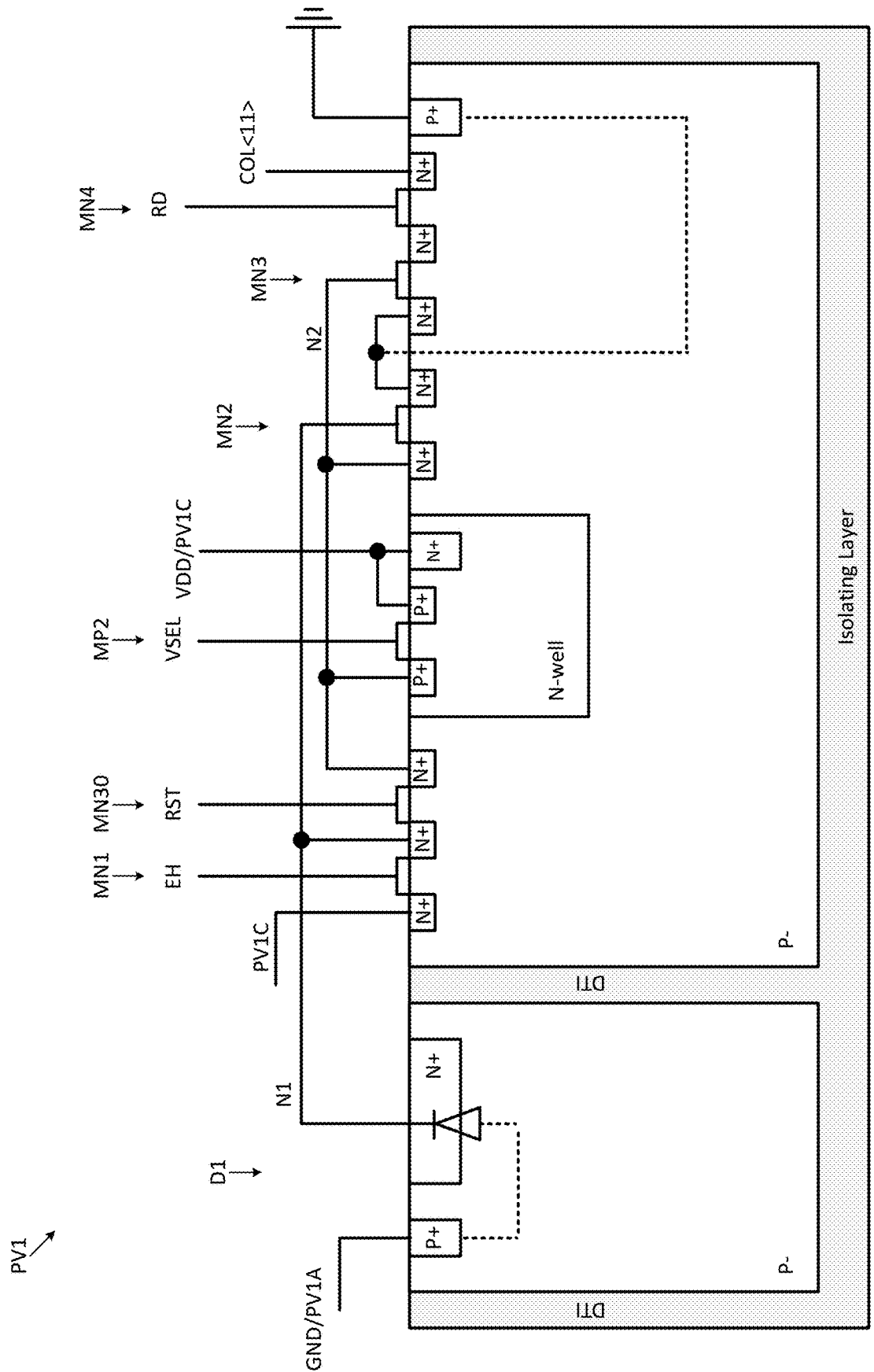
FIG. 5 is a diagrammatical cross sectional view of a pixel of FIG. 3.

As explained above, each pixel includes a photodiode separated from the transistors of that pixel (and from other photodiodes and other pixels) by full thickness deep trench isolation. As an example, shown in FIG. 5 is a diagrammatical cross sectional view of the pixel PV1. As can be seen, the lightly doped P– region of the photodiode D1 is formed on an isolating layer and surrounded by the full thickness deep trench isolation (DTI), while the heavily doped P+ and N+ regions of the D1 are formed within the lightly doped P– region of the photodiode D1.

The lightly doped P– region in which the various heavily doped regions of the transistors MN1, MN2, MN3, MN4, MN30, and MP2 are formed is formed on the isolating layer and separated from the lightly doped P– region of the photodiode D1 by the full thickness deep trench isolation.

Although this structure described above and shown in FIG. 5 is for the pixel PV1 of a given pixel group, it should be understood that each pixel of the pixel array 101 may have this structure.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An imaging sensor, comprising:
   a pixel array, each pixel of the pixel array containing a photodiode, each photodiode being isolated by a deep trench isolation;
   mode selection circuitry configured to control which groups of pixels of the pixel array operate in an imaging mode and which other groups of pixels of the pixel array operate in an energy harvesting mode; and
   switch circuitry configured to selectively connect different groups of photodiodes in rows operating in the energy harvesting mode into forward biased series configurations between a voltage output line and a ground line, or into forward biased parallel configurations between the voltage output line and the ground line;
   wherein the switch circuitry connects a given group of photodiodes into the forward biased series configuration by directly electrically connecting an anode of a first photodiode of the given group to the voltage output line, directly electrically connecting an anode of a second photodiode of the given group to a cathode of the first photodiode of the given group, directly electrically connecting an anode of a third photodiode of the given group to a cathode of the second photodiode of the given group, directly electrically connecting an anode of a fourth photodiode of the given group to a cathode of the third photodiode of the given group, and directly electrically connecting a cathode of the fourth photodiode of the given group to the ground line.

2. The imaging sensor of claim 1, wherein the switch circuitry connects a given group of photodiodes into the forward biased series configuration by connecting an anode of a first photodiode of the given group to the voltage output line, connecting an anode of a second photodiode of the given group to a cathode of the first photodiode of the given group, connecting an anode of a third photodiode of the given group to a cathode of the second photodiode of the given group, connecting an anode of a fourth photodiode of the given group to a cathode of the third photodiode of the given group, and connecting a cathode of the fourth photodiode of the given group to the ground line.

3. The imaging sensor of claim 1, wherein the switch circuitry connects a given group of photodiodes into the forward biased parallel configuration by connecting an anode of a first photodiode of the given group to the voltage output line, connecting an anode of a second photodiode of the given group to a cathode of the first photodiode of the given group, connecting a cathode of the second photodiode of the given group to the ground line, connecting an anode of a third photodiode of the given group to the voltage output line, connecting an anode of a fourth photodiode of the given group to a cathode of the third photodiode of the given group, and connecting a cathode of the fourth photodiode of the given group to the ground line.

4. The imaging sensor of claim 1, wherein the switch circuitry connects a given group of photodiodes into the forward biased parallel configuration by connecting an anode of a first photodiode of the given group to the voltage output line and connecting a cathode of the first photodiode of the given group to the ground line, connecting an anode of a second photodiode of the given group to the voltage output line and connecting a cathode of the second photodiode of the given group to the ground line, connecting an anode of a third photodiode of the given group to the voltage output line and connecting a cathode of the third photodiode of the given group to the ground line, and connecting an anode of a fourth photodiode of the given group to the voltage output line and connecting a cathode of the fourth photodiode of the given group to the ground line.

5. The imaging sensor of claim 1, wherein the switch circuitry is configured to connect at least one group of photodiodes in rows operating in the energy harvesting mode into the forward biased series configuration and to connect at least one group of photodiodes in rows operating in the energy harvesting mode into the forward biased parallel configuration.

6. The imaging sensor of claim 1, wherein each group of photodiodes is comprised of four photodiodes.

7. The imaging sensor of claim 1, wherein each row of photodiodes is selectively switchable between the imaging mode and the energy harvesting mode.

8. The imaging sensor of claim 1,
wherein the mode selection circuitry comprises, for each first pixel of a given group of pixels, an imaging selection transistor coupling an anode of the photodiode of that pixel to ground when in the imaging mode and an energy harvesting selection transistor coupling a cathode of the photodiode of that pixel to ground when in the energy harvesting mode; and
wherein the mode selection circuitry comprises, for each pixel of the given pixel group other than the first pixel of the given pixel group, an imaging selection transistor coupling an anode of the photodiode of that pixel to ground when in the imaging mode and an energy harvesting selection transistor coupling a cathode of the photodiode of that pixel to the switch circuitry for that pixel when in the energy harvesting mode.

9. The imaging sensor of claim 8, wherein the switch circuitry comprises, for each pixel of the given pixel group except a last pixel of the given pixel group:
a transmission gate selectively coupling the anode of the photodiode of that pixel to the energy harvesting selection transistor of a next pixel of the given pixel group; and
a selection transistor selectively coupling the energy harvesting selection transistor of the next pixel of the given pixel group to ground when the transmission gate is not coupling the anode of the photodiode of that pixel to the energy harvesting selection transistor of the next pixel of the given pixel group.

10. An imaging sensor, comprising:
an array of pixels, the array of pixels subdivided into a plurality of pixel group rows, each of the plurality of pixel group rows being subdivided into a plurality of pixel groups, wherein each pixel group of the plurality of pixel groups comprises:
a first pixel comprising:
a first photodiode; and
mode selection circuitry coupling an anode of the first photodiode to ground when the pixel group row of the plurality of pixel group rows to which the pixel group of the plurality of pixel groups belongs is in an imaging mode and directly electrically connecting a cathode of the first photodiode to ground when the pixel group row of the plurality of pixel group rows to which the pixel group of the plurality of pixel groups belongs is in an energy harvesting mode;
interconnection circuitry coupled between the pixel group of the plurality of pixel groups and an output line; and a last pixel comprising:
a last photodiode; and
mode selection circuitry coupling a cathode of the last photodiode to ground when the pixel group row of the plurality of pixel group rows to which the pixel group of the plurality of pixel groups belongs is in the energy harvesting mode and the last pixel is in an isolated mode, coupling the cathode of the last photodiode to the interconnection circuitry when the pixel group row of the plurality of pixel group rows to which the pixel group of the plurality of pixel groups belongs is in the energy harvesting mode and the last pixel is in an interconnected mode, and coupling an anode of the last photodiode to ground when the pixel group row of the plurality of pixel group rows to which the pixel group of the plurality of pixel groups belongs is in the imaging mode.

11. The imaging sensor of claim 10, wherein the mode selection circuitry of the first pixel comprises:
a first n-channel transistor having a source directly electrically connected to ground, a drain directly electrically connected to the anode of the first photodiode, and a gate coupled to an imaging selection signal that is asserted when the pixel group row of the plurality of pixel group rows to which the pixel group of the plurality of pixel groups belongs is in the imaging mode; and
a second n-channel transistor having a source directly electrically connected to ground, a drain directly electrically connected to the cathode of the first photodiode, and a gate coupled to an energy harvesting selection signal that is asserted when the pixel group row of the plurality of pixel group rows to which the pixel group of the plurality of pixel groups belongs is in the energy harvesting mode.

12. The imaging sensor of claim 11, wherein each pixel group of the plurality of pixel groups further comprises:
a second pixel comprising:
a second photodiode; and
mode selection circuitry coupling an anode of the second photodiode to ground when the pixel group row of the plurality of pixel group rows to which the pixel group of the plurality of pixel groups belongs is in the imaging mode, coupling the anode of the second photodiode to ground when the pixel group row of the plurality of pixel group rows to which the pixel group of the plurality of pixel groups belongs is in the energy harvesting mode and the second pixel is in an isolated mode, and coupling the anode of the second photodiode to the interconnection circuitry when the pixel group row of the plurality of pixel group rows to which the pixel group of the plurality of pixel groups belongs is in the energy harvesting mode and the second pixel is in an interconnected mode,
wherein the mode selection circuitry comprises:
a third n-channel transistor having a source coupled to ground, a drain coupled to the anode of the second photodiode, and a gate coupled to the imaging selection signal; and
a fourth n-channel transistor having a source coupled to the interconnection circuitry, a drain coupled to the cathode of the second photodiode, and a gate coupled to the energy harvesting selection signal.

13. The imaging sensor of claim 12, wherein the interconnection circuitry comprises:
   a first transmission gate coupled between the anode of the first photodiode and the source of the fourth n-channel transistor, the first transmission gate operating based upon a result of a logical OR operation performed on a second control signal and a third control signal;
   a fifth n-channel transistor having a source coupled to ground, a drain coupled to the source of the fourth n-channel transistor, and a gate coupled to a first control signal; and
   a first transistor having a source coupled to the output line, a drain coupled to the anode of the first photodiode, and a gate coupled to the first control signal.

14. The imaging sensor of claim 13, wherein each pixel group of the plurality of pixel groups further comprises:
   a third pixel comprising:
      a third photodiode; and
      mode selection circuitry coupling an anode of the third photodiode to ground when the pixel group row of the plurality of pixel group rows to which the pixel group of the plurality of pixel groups belongs is in the imaging mode, coupling the anode of the third photodiode to ground when the pixel group row of the plurality of pixel group rows to which the pixel group of the plurality of pixel groups belongs is in the energy harvesting mode and the third pixel is in an isolated mode, and coupling the anode of the third photodiode to the interconnection circuitry when the pixel group row of the plurality of pixel group rows to which the pixel group of the plurality of pixel groups belongs is in the energy harvesting mode and the third pixel is in an interconnected mode,
      wherein the mode selection circuitry comprises:
         a sixth n-channel transistor having a source coupled to ground, a drain coupled to the anode of the third photodiode, and a gate coupled to the imaging selection signal; and
         a seventh n-channel transistor having a source coupled to the interconnection circuitry, a drain coupled to the cathode of the third photodiode, and a gate coupled to the energy harvesting selection signal.

15. The imaging sensor of claim 14, wherein the interconnection circuitry further comprises:
   a second transmission gate coupled between the anode of the second photodiode and the source of the seventh n-channel transistor, the second transmission gate operating based upon the third control signal;
   an eighth n-channel transistor having a source coupled to ground, a drain coupled to the source of the seventh n-channel transistor, and a drain coupled to a result of the logical OR operation performed on the first control signal and the second control signal; and
   a second transistor having a source coupled to the output line, a drain coupled to the anode of the second photodiode, and a gate coupled to the result of the logical OR operation performed on the first control signal and the second control signal.

16. The imaging sensor of claim 15, wherein the mode selection circuitry of the last pixel comprises:
   a ninth n-channel transistor having a source coupled to ground, a drain coupled to the anode of the last photodiode, and a gate coupled to the imaging selection signal; and
   a tenth n-channel transistor having a drain coupled to the cathode of the last photodiode, a source coupled to the interconnection circuitry, and a gate coupled to the energy harvesting selection signal.

17. The imaging sensor of claim 16, wherein the interconnection circuitry further comprises:
   a third transistor having a source coupled to the output line, a drain coupled to the anode of the third photodiode, and a gate coupled to the first control signal;
   a third transmission gate coupled between the anode of the third photodiode and the source of the tenth n-channel transistor, the third transmission gate operating based upon the result of the logical OR operation performed on the second control signal and the third control signal;
   an eleventh n-channel transistor having a drain coupled to the source of the tenth n-channel transistor, a source coupled to ground, and a gate coupled to the first control signal; and
   a fourth transistor having a source coupled to the output line, a drain coupled to the anode of the last photodiode, and a gate coupled to a result of a logical OR operation performed on the first control signal, second control signal, and third control signal.

18. An imaging sensor, comprising:
   an array of pixels, the array of pixels subdivided into a plurality of pixel group rows, each of the plurality of pixel group rows being subdivided into a plurality of pixel groups, wherein each pixel group of the plurality of pixel groups comprises:
      a first pixel comprising:
         a first photodiode having a cathode and an anode; and
         mode selection circuitry comprising:
            a first n-channel transistor having a source coupled to ground, a drain coupled to the anode of the first photodiode, and a gate coupled to an imaging selection signal that is asserted when the pixel group row of the plurality of pixel group rows to which the pixel group of the plurality of pixel groups belongs is in an imaging mode; and
            a second n-channel transistor having a source coupled to ground, a drain coupled to the cathode of the first photodiode, and a gate coupled to an energy harvesting selection signal that is asserted when the pixel group row of the plurality of pixel group rows to which the pixel group of the plurality of pixel groups belongs is in an energy harvesting mode;
      interconnection circuitry coupled between the pixel group of the plurality of pixel groups and an output line; and
      a second pixel comprising:
         a second photodiode having an anode and a cathode; and
         mode selection circuitry comprising:
            a third n-channel transistor having a source coupled to ground, a drain coupled to the anode of the second photodiode, and a gate coupled to the imaging selection signal; and
            a fourth n-channel transistor having a source coupled to the interconnection circuitry, a drain coupled to the cathode of the second photodiode, and a gate coupled to the energy harvesting selection signal;
      wherein the interconnection circuitry comprises:
         a first transmission gate coupled between the anode of the first photodiode and the source of the fourth n-channel transistor, the first transmission gate operating based upon a result of a logical OR operation performed on a second control signal and a third control signal;

a fifth n-channel transistor having a source coupled to ground, a drain coupled to the source of the fourth n-channel transistor, and a gate coupled to a first control signal; and a first transistor having a source coupled to the output line, a drain coupled to the anode of the first photodiode, and a gate coupled to the first control signal.

19. The imaging sensor of claim 18, wherein each pixel group of the plurality of pixel groups further comprises:

a third pixel comprising:

a third photodiode having an anode and a cathode; and mode selection circuitry comprising:

a sixth n-channel transistor having a source coupled to ground, a drain coupled to the anode of the third photodiode, and a gate coupled to the imaging selection signal; and a seventh n-channel transistor having a source coupled to the interconnection circuitry, a drain coupled to the cathode of the third photodiode, and a gate coupled to the energy harvesting selection signal.

20. The imaging sensor of claim 19, wherein the interconnection circuitry further comprises:

a second transmission gate coupled between the anode of the second photodiode and the source of the seventh n-channel transistor, the second transmission gate operating based upon the third control signal;

an eighth n-channel transistor having a source coupled to ground, a drain coupled to the source of the seventh n-channel transistor, and a drain coupled to a result of the logical OR operation performed on the first control signal and the second control signal; and a second transistor having a source coupled to the output line, a drain coupled to the anode of the second photodiode, and a gate coupled to the result of the logical OR operation performed on the first control signal and the second control signal.

21. The imaging sensor of claim 20, wherein each pixel group of the plurality of pixel groups further comprises:

a last pixel comprising:

a last photodiode having an anode and a cathode; and mode selection circuitry comprising:

a ninth n-channel transistor having a source coupled to ground, a drain coupled to the anode of the last photodiode, and a gate coupled to the imaging selection signal; and a tenth n-channel transistor having a drain coupled to the cathode of the last photodiode, a source coupled to the interconnection circuitry, and a gate coupled to the energy harvesting selection signal.

22. The imaging sensor of claim 21, wherein the interconnection circuitry further comprises:

a third transistor having a source coupled to the output line, a drain coupled to the anode of the third photodiode, and a gate coupled to the first control signal;

a third transmission gate coupled between the anode of the third photodiode and the source of the tenth n-channel transistor, the third transmission gate operating based upon the result of the logical OR operation performed on the second control signal and the third control signal;

an eleventh n-channel transistor having a drain coupled to the source of the tenth n-channel transistor, a source coupled to ground, and a gate coupled to the first control signal; and a fourth transistor having a source coupled to the output line, a drain coupled to the anode of the last photodiode, and a gate coupled to a result of a logical OR operation performed on the first control signal, second control signal, and third control signal.

* * * * *